(12) United States Patent
Hornchek et al.

(10) Patent No.: US 6,541,991 B1
(45) Date of Patent: Apr. 1, 2003

(54) INTERFACE APPARATUS AND METHOD FOR TESTING DIFFERENT SIZED BALL GRID ARRAY INTEGRATED CIRCUITS

(75) Inventors: Eric D. Hornchek, deceased, late of San Jose, CA (US), by Soon Hee Lee Horncek, legal representative; Mohsen H. Mardi, San Jose, CA (US)

(73) Assignee: Xilinx Inc., San Jose, CA (US)

(*) Notice: Subject to any disclaimer, the term of this patent is extended or adjusted under 35 U.S.C. 154(b) by 26 days.

(21) Appl. No.: 09/849,815

(22) Filed: May 4, 2001

(51) Int. Cl.[7] ............................................. G01R 31/02
(52) U.S. Cl. ........................ 324/755; 324/754; 324/761
(58) Field of Search ............................... 324/754, 755, 324/758, 761, 765; 439/66, 71, 700, 912

(56) References Cited

U.S. PATENT DOCUMENTS

| | | | |
|---|---|---|---|
| 5,688,127 A | * 11/1997 | Staab et al. | 439/66 |
| 5,955,888 A | 9/1999 | Frederickson et al. | |
| 6,220,870 B1 | * 4/2001 | Barabi et al. | 439/71 |
| 6,300,781 B1 | * 10/2001 | Yap et al. | 324/755 |
| 6,420,885 B1 | * 7/2002 | Fredrickson | 324/754 |

\* cited by examiner

*Primary Examiner*—Kamand Cuneo
*Assistant Examiner*—Minh N. Tang
(74) *Attorney, Agent, or Firm*—Patrick T. Bever; Bever Hoffman & Harms; Edel M. Young

(57) ABSTRACT

An interface apparatus including a nesting member having a central test area, a positioning member surrounding the test area, and several removable adapters held by the positioning member to expose a selected portion of the test area. Each removable adapter includes a central opening that is sized to receive a corresponding ball grid array integrated circuits (BGA IC). During a first test procedure, a relatively small BGA IC is inserted through the relatively small central opening of a corresponding first adapter. The first adapter is then removed and replaced with a second adapter having a relatively large central opening. A second test procedure is then performed by inserting a relatively large BGA IC through the relatively large central opening formed in the second adapter.

12 Claims, 5 Drawing Sheets

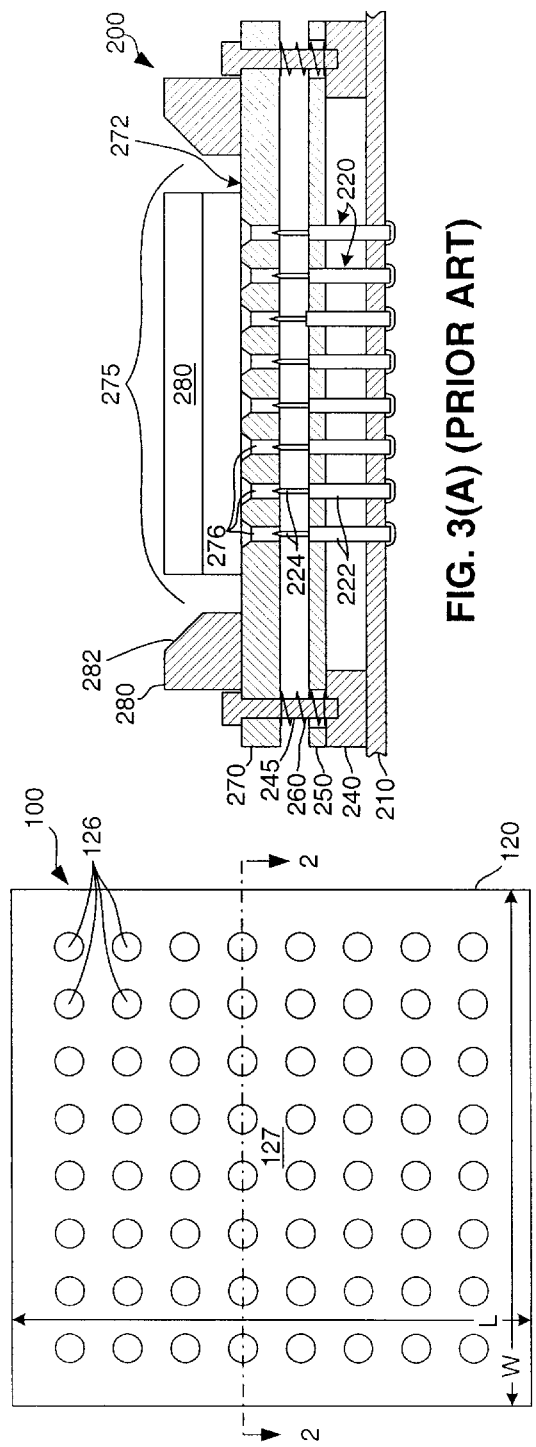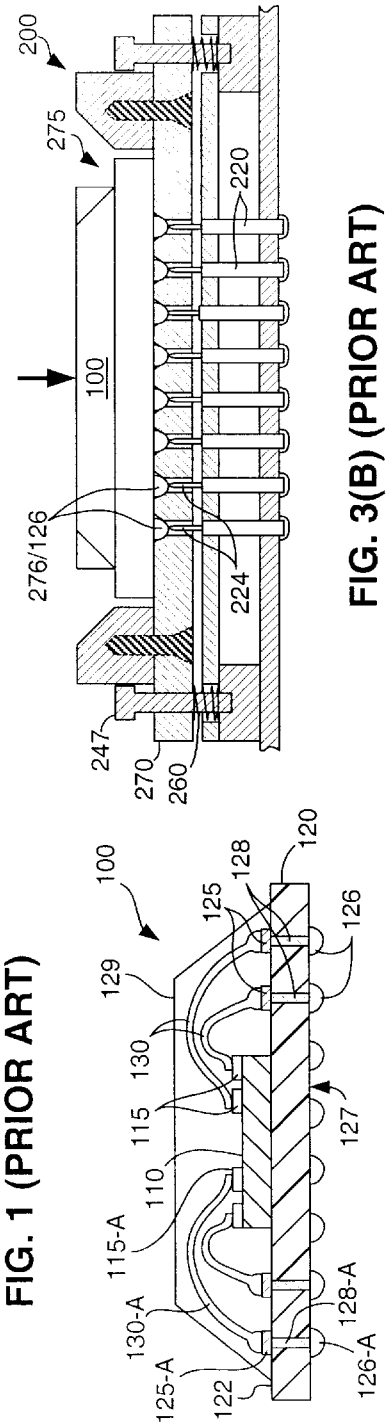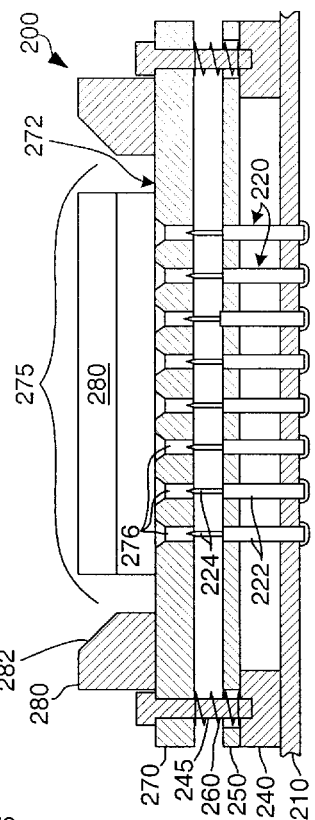
FIG. 1 (PRIOR ART)
FIG. 2 (PRIOR ART)
FIG. 3(A) (PRIOR ART)
FIG. 3(B) (PRIOR ART)

INTERFACE APPARATUS AND METHOD FOR TESTING DIFFERENT SIZED BALL GRID ARRAY INTEGRATED CIRCUITS

FIELD OF THE INVENTION

The present invention relates to integrated circuit device testers, and more particularly to an apparatus and method for providing electrical connections between ball grid array (BGA) packaged integrated circuits under test and the integrated circuit device testers.

BACKGROUND OF THE INVENTION

Integrated circuit (IC) devices typically include an IC chip that is housed in a plastic, ceramic or metal package. The IC chip includes an integrated circuit formed on a thin wafer of silicon. The package supports and protects the IC chip and provides electrical connections between the integrated circuit and an external circuit or system.

There are several package types, including ball grid arrays (BGAs), pin grid arrays (PGAs), plastic leaded chip carriers, and plastic quad flat packs. Each of the package types is typically available in numerous sizes. The package type selected by an IC manufacturer for a particular IC chip is typically determined by the size/complexity of the IC chip (i.e., the number of input/output terminals), and also in accordance with a customer's requirements.

FIGS. 1 and 2 show bottom and side sectional views, respectively, of a typical BGA IC 100 including an IC chip 110 mounted on an upper surface 122 of a package substrate 120. Electrical connections between bonding pads 115 of IC chip 110 and contact pads 125 formed on upper surface 122 of substrate 120 are provided by bond wires 130. A plurality (sixty-four shown) of solder balls (sometimes referred to as solder bumps) 126 extend from a lower surface 127 of substrate 120 which are electrically connected to the conductive lines (not shown) 120 and conductive vias 128 that are provided on substrate 120. Electrical signals travel between each solder ball 126 and one bonding pad 115 of IC chip 110 along an associated conductive line/via 128 and bond wire 130. For example, a test signal applied to solder ball 126-A is transmitted on conductive via 128A to contact pad 125A, and from contact pad 125A along bond wire 130A to bonding pad 115 of substrate 110. A cover 129, such as a cap or "glob top", is placed or formed over IC chip 110 and bond wires 130 for protection.

IC testing systems are used by IC manufacturers to test their ICs before shipping to customers. IC testing systems typically include a device tester, a device handler and an interface structure. A device tester is an expensive piece of computing equipment that transmits test signals via tester probes to an interface structure. The interface structure transmits signals between the leads of an IC under test and the device tester. A device handler is an expensive precise robot for automatically moving ICs from a storage area to the interface structure and back to the storage area. Such testing systems are well known.

FIGS. 3(A) and 3(B) show side and top views of a conventional interface structure 200 that is disclosed in U.S. Pat. No. 5,955,888.

Interface structure 200 includes a printed circuit board (PCB) 210 having mounted thereon a plurality of pogo pins 220, a contactor body 240 mounted on PCB 210, and a nesting member 270 that is mounted over contactor body 240. PCB 210 includes connection structures (not shown) for receiving test signals from a device tester, and conductive lines (also not shown) for transmitting signals between the connection structures and pogo pins 220. Contactor body 240 includes four walls that are formed into a generally square or rectangular frame through which pogo pins 220 extend. A non-conductive plate 250 is mounted on an upper surface of contactor body 240 for aligning pogo pins 220 such that a tip 224 of each pogo pin 220 is aligned with a corresponding through-hole 276 formed in nesting member 270. Nesting member 270 is slidably mounted on shoulder bolts 245 that extend upward from contactor body 240, and is biased away from contactor body 240 by coil springs 260. Mounted on an upper surface 272 of nesting member 270 is a fixed (permanently attached) series alignment structures 280 that define an IC receiving (test) area 275, which includes through-holes 276.

Referring to FIG. 3(B), during a test procedure a BGA IC 100 is lowered into IC receiving area 275 of nesting member 270 by a device handler (not shown). Alignment structures 280 are formed with slanted walls 282 that facilitate "rough" alignment by causing BGA IC 100 to slide into IC receiving area 275. Subsequently, each solder ball 126 becomes engaged with an associated through-hole 276, which are chamfered to provide "fine" alignment of BGA IC 100 relative to pogo pins 220. BGA IC 100 and nesting member 270 are then pressed downward (as indicated by the arrow) to compress springs 260 until tips 224 of pogo pins 220 contact solder balls 126, thereby providing electrical connections between a testing device (not shown) connected to pogo pins 220 and IC device 100 for the testing procedure.

A problem associated with conventional interface apparatus 200 is that each apparatus can only support a single BGA IC package size (i.e., the peripheral size of the package substrate). Accordingly, an IC manufacturer utilizing several BGA IC package sizes must purchase a separate interface apparatus for each BGA IC package, thereby increasing total device testing costs.

What is needed is a method for testing different sized BGA ICs using a single interface apparatus.

SUMMARY OF THE INVENTION

The present invention is directed to testing BGA ICs having various package sizes using a single interface apparatus and a set of inexpensive removable/replaceable adapters, thereby significantly reducing costs associated with testing an entire line of BGA ICs by eliminating the need for individual interface apparatus for each BGA IC.

In accordance with an embodiment of the present invention, an interface apparatus includes a nesting member having a central test area, a positioning member surrounding the test area, and a plurality of removable adapters that are held by the positioning member. Each removable adapter includes a central opening that is sized to receive a ball grid array integrated circuit (BGA IC) having a corresponding package size.

In accordance with another embodiment of the present invention, a method for testing BGA ICs having different package sizes using a single interface apparatus includes testing a first BGA IC having a first package size using a first adapter, and then testing a second BGA IC having a second package size using a second adapter. For example, during a first test procedure, a first adapter having a relatively small central opening is mounted on the nesting member of the interface apparatus such that a relatively small portion of the test area is exposed through the central opening. A relatively small first BGA IC is then inserted manually or by a handler through the central opening of the first adapter, and is pressed downward such that the solder balls of the first BGA IC contact a relatively small number of the pogo pins located under the nesting member. Test signals are then transmitted to and from the first BGA IC on the relatively small number of pogo pins using known methods. The first BGA IC and the first adapter are then removed and replaced with a second adapter having a relatively large central opening. A second test procedure is then performed by inserting a relatively large BGA IC through the central opening of the second adapter, and pressing downward such that the solder balls of the second BGA IC contact a relatively large number of the pogo pins. Test signals are then transmitted to and from the second BGA IC using the relatively large number of pogo pins.

BRIEF DESCRIPTION OF THE DRAWINGS

These and other features, aspects and advantages of the present invention will become better understood with regard to the following description, appended claims, and accompanying drawings, where:

FIG. 1 is a bottom of a BGA IC;

FIG. 2 is a sectional side view taken along line 2—2 of FIG. 1;

FIGS. 3(A) and 3(B) are sectional side views of a conventional interface structure for testing BGA ICs;

DETAILED DESCRIPTION OF THE DRAWINGS

Figure 4:
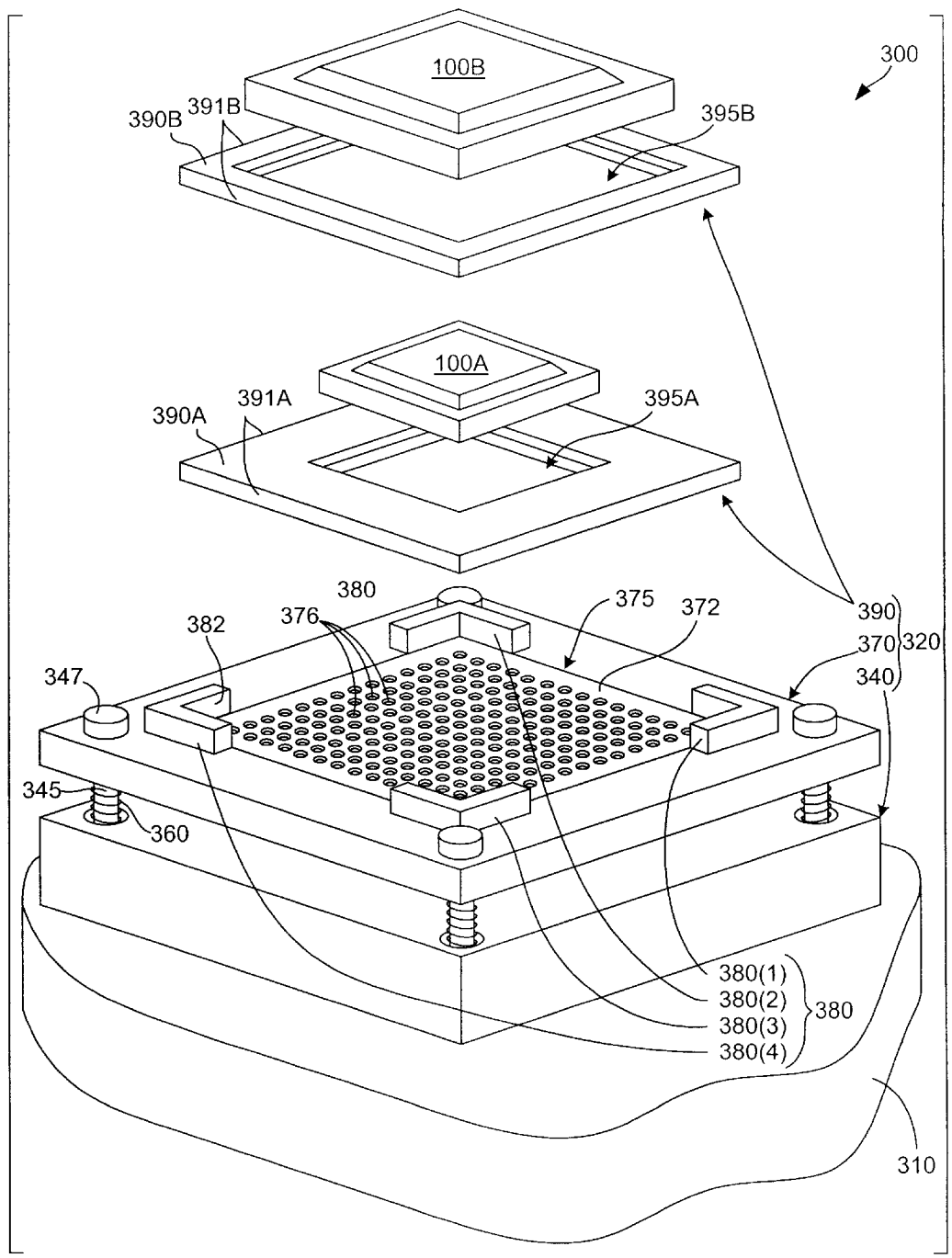
FIG. 4 is an exploded perspective view showing an interface apparatus according to an embodiment of the present invention.

FIG. 4 is an exploded perspective view showing an interface apparatus 300 in accordance with an embodiment of the present invention. Interface apparatus 300 is utilized with a device tester to facilitate testing of ball grid array integrated circuits (BGA ICs) that have more than one package size, such as relatively small BGA IC 100A and relatively large BGA IC 100B, both of which are shown in FIG. 4.

As used herein, the term "BGA IC" refers to any IC product having solder balls or bumps for connecting a packaged integrated circuit to external circuitry. In addition, the term "package size" is used to describe the peripheral size and shape of a BGA IC substrate (i.e., lateral length L and width W of a BGA IC 100; see FIG. 1). For example, referring to FIG. 4, first BGA IC 100A has a relatively small square package size in comparison to that of a second BGA IC 100B, shown above first BGA IC 100A.

Interface apparatus 300 generally includes a printed circuit board (PCB) 310 and a contactor 320. Contactor 320 includes a fixed base 340 that is fixedly mounted on PCB 310 (e.g., by screws or other fastening means), a nesting member 370 that is slidably mounted on guide shafts 345 extending from an upper surface of fixed base 340, and two or more adapters 390 (e.g., first adapter 390A and second adapter 390B) that are interchangeably mountable on nesting member 370.

In accordance with an aspect of the present invention, nesting member 370 includes a positioning member 380 that is permanently attached to an upper surface 372 for securing a selected adapter 390A or 390B over a test area 375 located on an upper surface of nesting member 370. Test area 375 includes an array of through-holes 376 that are provided on nesting member 370, and facilitates testing of a selected BGA IC in the manner described below. In the disclosed embodiment, positioning member 380 includes four angled portions 380(1) through 380(4) that form a frame surrounding test area 375. Each selected adapter 390A and 390B has an outer peripheral edge (391A and 391B, respectively) that is shaped to fit snuggly within the frame formed by positioning member 380 such that when a selected adapter 390A and 390B is mounted on nesting member 370, positioning member 380 resists lateral movement of the first adapter relative to upper surface 372. In other embodiments, positioning member may include a continuous (e.g., square) frame, or may include only straight side pieces (i.e., omit the corner portions of angled pieces 380(1) through 380(4)). Hooks or other extensions may be provided on the adapters that are received within corresponding holes formed in nesting member 370 to resist vertical movement of the adapters. Alternatively, movable arms may be formed on positioning member 380 that can be moved over the corners of the adapters when mounted on nesting member 370.

In accordance with another aspect of the present invention, adapters 390A and 390B define different sized central openings 395A and 395B such that interface apparatus 300 facilitates testing BGA ICs having different package sizes (e.g., BGA ICs 100A and 100B) using a single nesting member 370. For example, adapter 390A defines a relatively small central opening 395A that is slightly larger than the package size of BGA IC 100A, and adapter 390B defines a relatively large central opening 395B that is slightly larger than the package size of BGA IC 100B. Further, when a selected adapter 390A or 390B is mounted on nesting member 370, its central opening 395A or 395B exposes a predetermined selected region of test area 375, thereby positioning a selected BGA IC 100A or 100B on the selected region of test area 375. Note that the selected region of test area 375 exposed by first adapter 390A is smaller (i.e., includes fewer through-holes 376) than the selected region of test area 375 exposed by second adapter 390B. In one embodiment, each adapter 390A and 390B is formed from a rigid anti-static plastic.

Figure 5:
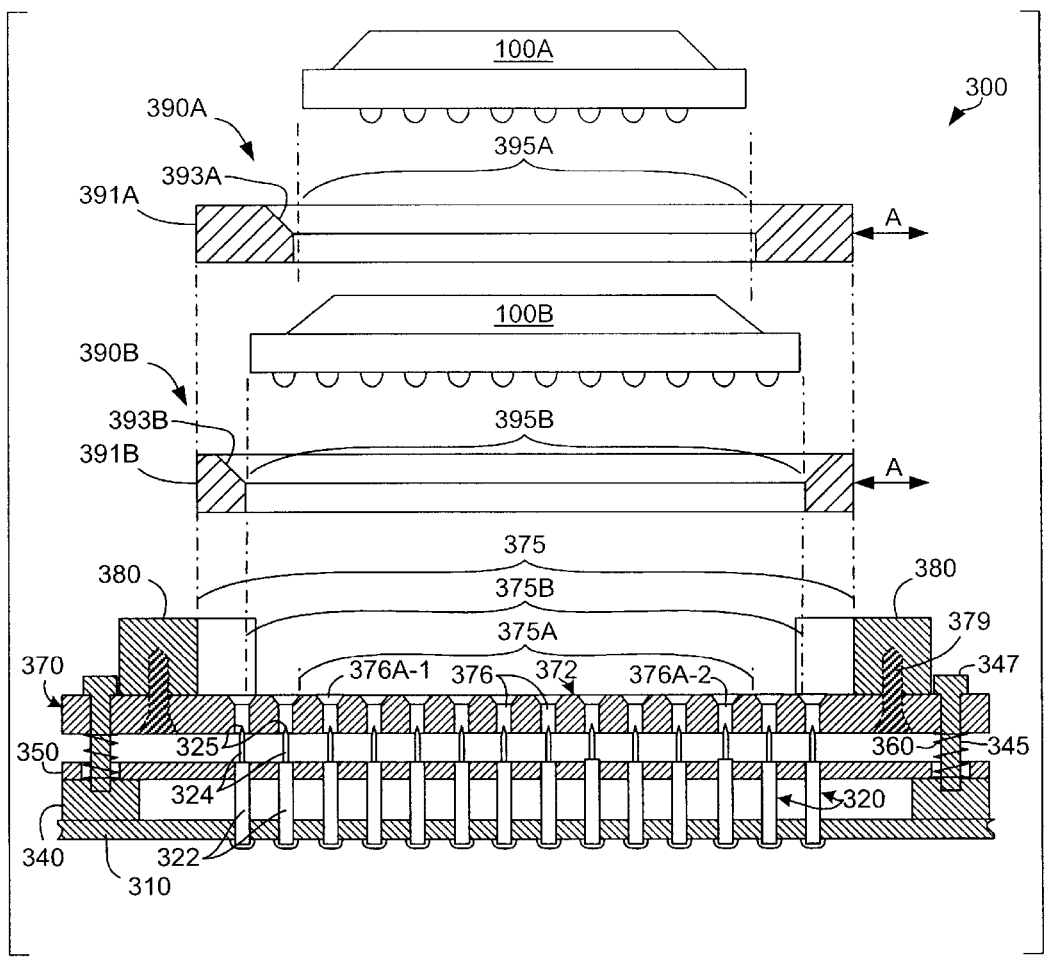
FIG. 5 is a sectional side view of the interface structure of FIG. 4.

FIG. 5 is an exploded cross-sectional side view showing interface apparatus 300 in additional detail.

Referring to the lower portion of FIG. 5, a plurality of standard spring-loaded pogo pins (spring probes) 320 are fixed to PCB 310 in a manner similar to that described in U.S. Pat. No. 5,955,888, which is incorporated herein in its entirety. Each pogo pin 320 includes a barrel (fixed portions) 322 that is soldered to corresponding conductive trace formed on PCB 310, and a spring-biased plunger (movable portion) 324 having a pointed tip 325 that extends through a central opening in fixed base 340 of contactor 320. Each pogo pin 320 is formed from conductive materials, so test signals are transmitted between the conductive traces formed on PCB 310 and plunger 324.

Fixed body 340 is a box-shaped structure that is fixedly mounted on PCB 310 and surrounds pogo pins 320. In one embodiment, a non-conductive plate 350 mounted on an upper surface of fixed body 340, and coil springs (resilient members) 360 are mounted over guide shafts 345 extending through openings formed in non-conductive plate 350. Non-conductive plate 350 aligns plungers 324 of pogo pins 320 with corresponding through-holes formed in nesting member 370. If fixed body 340 is formed from a conductive material, a non-conductive spacer (not shown) may be mounted between contactor body 340 and PCB 310 to avoid electrical short-circuiting.

Nesting member 370 is slidably mounted on guide shafts 345 and biased away from fixed body 340 by coil springs 360. The upward movement of nesting member 370 is restricted by heads 347 formed on the upper end of guide shafts 345. Test area 375 is located in a central region of nesting member 370, and is surrounded by positioning member 380. As mentioned above, through-holes 376 are located in test area 375, and each through-hole 376 is positioned over a plunger 324 of a corresponding pogo pin 320. Positioning member 380 is permanently attached to nesting member 370 (i.e., cannot be removed without significant effort), and includes slanted walls 382 that slope toward test area 375 for positioning gravity-feeding BGA ICs onto upper surface of nesting member 370. Positioning member 380 may be formed separately and mounted onto nesting member 370 using, for example, screws 379 or adhesive. Alternatively, positioning member 380 and nesting member 370 may be machined from a single piece of, for example, Vespel™ ( a registered trademark of E. I. du Pont de Nemours and Company) or other non-conductive material.

Referring to the upper portion of FIG. 5, in accordance with the present invention, outer peripheral edges 391A and 391B of adapters 390A and 390B are formed to snuggly fit between inner edges of positioning member 380 such that positioning member 380 resists lateral movement relative to upper surface 372 (i.e., in the direction of arrows A). In addition, central opening 395A of first adapter 390A has a relatively small size that is slightly larger than BGA IC 100A, thereby allowing BGA IC 100A to pass through first adapter 390A and be positioned in a first, relatively small selected region 375A of test area 375. Similarly, central opening 395B of second adapter 390B has a relatively large size that is slightly larger than BGA IC 100B, thereby allowing BGA IC 100B to pass through second adapter 390B and be positioned in a second, relatively large selected region 375B of test area 375.

According to another aspect of the present invention, interface apparatus 300 is provided with a relatively large number of through-holes 376 and corresponding pogo pins 320 so that the same assembly of fixed base 340 and nesting member 370 can be used to test BGA package sizes used by an IC manufacturer. Ideally, test area 375 is large enough to receive an IC manufacturer's largest BGA IC package (e.g., BGA IC 100B). Smaller BGA IC packages (e.g., BGA IC 100A) can also be tested by selected an appropriate adapter (e.g., adapter 390A). Accordingly, overall testing costs are reduced because, instead of needing a separate interface apparatus for each BGA IC package type, as required using conventional methods, an IC manufacturer needs only include one assembly of fixed base 340 and nesting member 370 and a series of inexpensive adapters to test all of the IC manufacturer's BGA ICs.

A device testing procedure utilizing interface apparatus 300 will now be described with reference to FIGS. 6A, 6B and 6C.

Figure 6A:
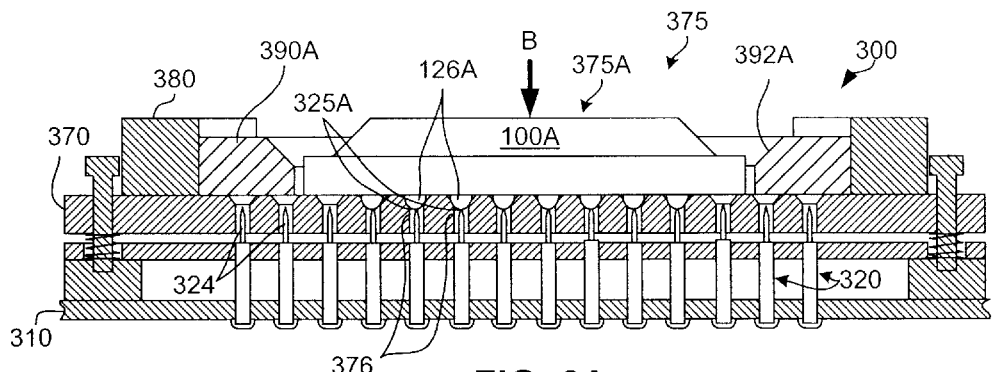
FIGS. 6A, 6B, and 6C are sectional side views of the interface structure of FIG. 4 illustrating the use of multiple adapters.
Figure 7:
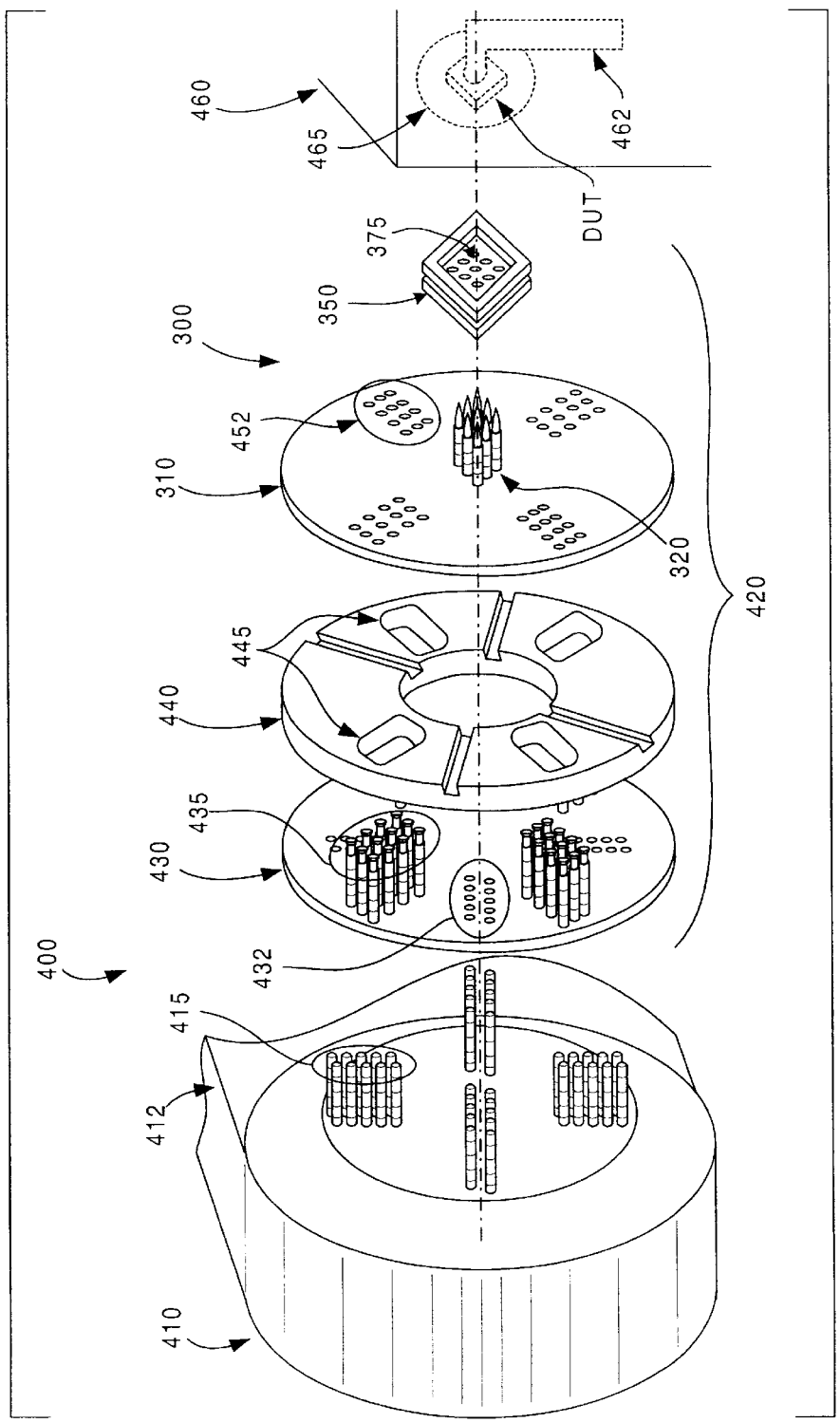
FIG. 7 is an exploded perspective view of a testing assembly utilizing the interface apparatus of FIG. 4.

Referring to FIG. 6A, interface apparatus 300 is prepared for testing relatively small BGA ICs 100A by temporarily mounting first adapter 390A onto nesting member 370 (i.e., such that first adapter 390A can be removed from nesting member 370 without significant effort). A device handler (refer to FIG. 7, below) then positions a BGA IC 100A over nesting member 370, and then releases BGA IC 100A so that it falls onto first adapter 390A. First adapter 390A includes a relatively long slanted wall 392A that facilitates "rough" positioning by causing BGA IC 100A to slide into the selected region 375A of test area 375. Subsequently, each solder ball 126A of BGA IC 100A becomes engaged with an associated chamfer of a corresponding through hole 376, thereby providing "fine" alignment of BGA IC 100A relative to pogo pins 320. The device handler (not shown) then pushes BGA IC 100A and nesting member 370 downward toward pogo pins 320 (as indicated by arrow B) such that a tip 325 of each plunger 324 extends through an associated through-hole 376 and contacts one solder ball 126A of BGA IC 100A. When solder balls 126A of BGA IC 100A are connected to pogo pins 320 as shown in FIG. 7, electrical test signals are then transmitted between PCB 310 and BGA IC 100A through pogo pins 320. Upon completion of the test signal transmission, the device handler then removes BGA IC 100A, and nesting member 370 is biased into the original position (shown in FIG. 5) by coil springs 360. The testing procedure shown in FIG. 6A is repeated as often as necessary to test all of an IC manufacturer's devices having the same package size as BGA IC 100A.

Figure 6B:
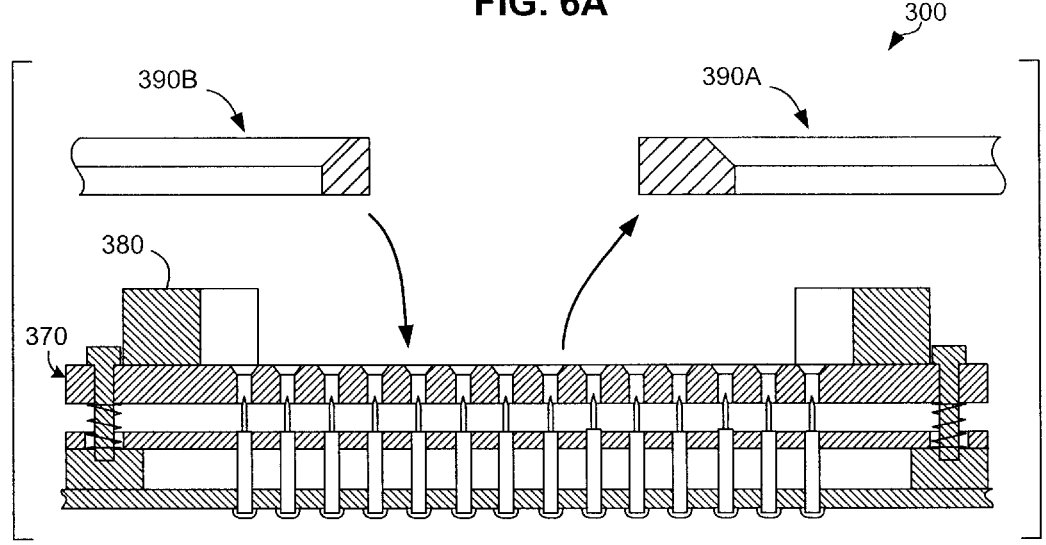
Figure 6C:
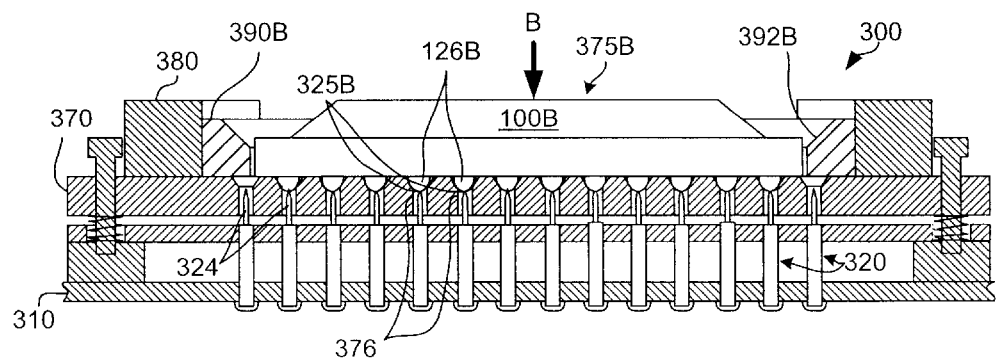

As indicated in FIG. 6B, when it is desirable to test IC devices having a different (e.g., larger) BGA IC package, first adapter 390A is removed from nesting member 370, and second adapter 390B is temporarily mounted thereon. Subsequently, as shown in FIG. 6C, the device handler moves a relatively large BGA IC 100B over nesting member 370, and then releases BGA IC device 100B so that it falls onto second adapter 390B, which is then tested in the same manner described above.

FIG. 7 is an exploded perspective view showing a test assembly 400 incorporating interface apparatus 300 in accordance with another aspect of the present invention. Test assembly 400 includes a standard ATE tester that typically includes a tester arm 410 (a portion of which is shown), a docking assembly 420, and a handler apparatus 460. Test arm 410 includes several tester pins 415 extending therefrom that are used to transmit and receive test signals from a processor (now shown) associated with the ATE tester. Docking assembly 420 includes a tester mother board 430, a non-conductive coplanarity plate 440, PCB (also referred to as a handler board) 310, and contactor 320 that provide an interface between tester arm 410 and handler 460 in the manner described in U.S. Pat. No. 5,955,888. Handler 460, shown in part at the right side of FIG. 7, typically includes a device handling mechanism, which is an expensive precise robot including an arm 462 for moving an IC device-under-test (DUT), such as BGA ICs 100A and 100B (described above) from a storage location to test site 375 during test procedures. Note that, when assembled, PCB 310 is mounted over an opening 465 such that handler 460 is able to mount a DUT directly onto test site 375. Test signals are transmitted from test arm 410 to mother board 430 via pins 415 that are received in corresponding contacts 432 formed on mother board 430. Mother board 430 includes a plurality of conductive traces (not shown) that transmit the test signals from contacts 432 to intermediate pogo pins 435. Coplanarity plate 440 is a non-conductive disk including openings 445 through which intermediate pogo pins 435 extend to transmit the test signals to contact pads 452, which are provided on PCB 310. PCB 310 includes a plurality of conductive traces (not shown) that transmit the test signals from contact pads 452 to pogo pins 320, from which the test signals are transmitted to the DUT in accordance with the procedure described above.

Although the present invention has been described with respect to certain specific embodiments, it will be clear to those skilled in the art that the inventive features of the present invention are applicable to other embodiments as well, all of which are intended to fall within the scope of the present invention.

What is claimed is:

1. An apparatus for interfacing between a device tester and a first ball grid array packaged integrated circuit (BGA IC), the apparatus comprising:
   a nesting member having an upper surface including a test area defining a plurality of through-holes, and a positioning member fixedly connected to the upper surface and located adjacent to the test area, the nesting member also defining a plurality of guide holes;
   a fixed base located below the nesting member and including a plurality of guide shafts that are slidably received in the guide holes formed in the nesting member;
   a first adapter that is temporarily mounted on the upper surface of the nesting member,
   wherein the first adapter includes an outer peripheral edge that fits within the positioning member such that the positioning member resists lateral movement of the first adapter relative to the upper surface of the nesting member, and
   wherein the first adapter defines a central opening for receiving the first BGA IC such that the first BGA IC is positioned on a selected region of the test area.

2. The apparatus according to claim 1,
   wherein the apparatus further comprises a second adapter that is selectively mountable on the upper surface of the nesting member when the first adapter is removed therefrom, and
   wherein the second adapter includes an outer peripheral edge that fits within the positioning member such that the positioning member resists lateral movement of the second adapter relative to the upper surface of the nesting member.

3. The apparatus according to claim 2, wherein the first adapter defines a relatively small central opening for receiving the first BGA IC, and the second adapter defines a relatively large central opening for receiving a second, relatively large BGA IC.

4. The apparatus according to claim 1,
   wherein the first adapter includes a slanted wall sloping toward the central opening such that the first BGA IC slides from the slanted wall onto the test area of the nesting member, and
   wherein the upper surface of the nesting member around each of the plurality of through-holes is chamfered to provide fine alignment of the first BGA IC within the nesting member.

5. The apparatus according to claim 1, wherein the first adapter comprises rigid, anti-static plastic.

6. The apparatus according to claim 1, wherein the positioning member comprises four angled walls that define a square-shaped region surrounding the test area.

7. The apparatus according to claim 1, further comprising a plurality of pogo pins located below the nesting member, wherein the nesting member is movable along the guide shafts between a first position in which tips of the pogo pins are located below the solder balls of the first BGA IC, and a second position in which the tips of the pogo pins extend into through-holes formed in the nesting member such that the pogo pins provide electrical connection between the solder balls of the first BGA IC and the device tester.

8. The apparatus according to claim 7, further comprising a circuit board,
   wherein each of the plurality of pogo pins includes a barrel soldered to the circuit board, a plunger movably mounted in the barrel, and a tip located at an end of the plunger, and
   wherein the fixed base includes a plurality of walls surrounding the plurality of pogo pins.

9. The apparatus according to claim 1, further comprising a resilient member disposed between the fixed base and the nesting member for biasing the nesting member away from the fixed base.

10. An assembly for testing a first ball grid array packaged integrated circuit (BGA IC), the assembly including:
    an automated device tester having a tester arm;
    a mother board mounted on the tester arm;
    a handler board connected to the mother board, the handler board including a plurality of pogo pins; and
    an interface apparatus mounted on the handler board, the interface apparatus comprising:
       a fixed base mounted on the handler board and surrounding the plurality of pogo pins, the handler board including a plurality of guide shafts;
       a nesting member having a plurality of guide holes slidably mounted on the guide shafts, the nesting member having an upper surface including a test area defining a plurality of through-holes, each through-hole being positioned over a corresponding pogo pin of the plurality of pogo pins, the nesting member also including a positioning member fixedly connected to the upper surface and located adjacent to the test area; and
       a first adapter that is temporarily mounted on the upper surface of the nesting member such that the positioning member resists lateral movement of the first adapter relative to the upper surface of the nesting member, wherein the first adapter defines a central opening for receiving the first BGA IC such that the first BGA IC is positioned on a selected region of the test area.

11. A method for testing a plurality of ball grid array (BGA) packaged integrated circuits (ICs) having various package sizes using a single interface apparatus, the method comprising:
    mounting a first removable adapter onto a nesting member of the interface apparatus, the nesting member having an upper surface including a test area defining a plurality of through-holes, wherein the first adapter is secured on the upper surface of the nesting member by a positioning member that is fixed to the upper surface of the nesting member and defines a central opening that exposes a first selected region of the test area; and
    inserting a first BGA IC through the central opening onto the nesting member such that solder balls of the first BGA IC are aligned by the first adapter over the first region of the test area.

12. The method according to claim 11, further comprising:
    removing the first adapter from the nesting member;
    mounting a second removable adapter onto the nesting member, wherein the second adapter is secured on the upper surface of the nesting member by the positioning member and defines a central opening that exposes a second selected region of the test area; and
    inserting a second BGA IC through the central opening onto the nesting member such that solder balls of the second BGA IC are aligned by the second adapter over the second region of the test area.

* * * * *